United States Patent
Kim et al.

(10) Patent No.: US 9,349,482 B2
(45) Date of Patent: May 24, 2016

(54) NONVOLATILE MEMORY DEVICE AND OPERATING METHOD THEREOF

(71) Applicant: SAMSUNG ELECTRONICS CO., LTD., Suwon-si, Gyeonggi-do (KR)

(72) Inventors: Ji-Suk Kim, Seoul (KR); Il Han Park, Suwon-si (KR); Jung-Ho Song, Suwon-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 14/639,331

(22) Filed: Mar. 5, 2015

(65) Prior Publication Data
US 2016/0027525 A1    Jan. 28, 2016

(30) Foreign Application Priority Data
Jul. 23, 2014    (KR) .................. 10-2014-0093320

(51) Int. Cl.
G11C 11/34    (2006.01)
G11C 16/34    (2006.01)
G11C 16/10    (2006.01)
G11C 16/26    (2006.01)

(52) U.S. Cl.
CPC .......... *G11C 16/3459* (2013.01); *G11C 16/107* (2013.01); *G11C 16/26* (2013.01)

(58) Field of Classification Search
USPC ............... 365/185.12, 185.17, 185.18, 185.2, 365/185.21, 185.24, 185.29, 185.33
See application file for complete search history.

(56) References Cited

U.S. PATENT DOCUMENTS

| | | | |
|---|---|---|---|
| 7,054,199 B2 | 5/2006 | Lee et al. | |
| 7,679,133 B2 | 3/2010 | Son et al. | |
| 7,826,271 B2 | 11/2010 | Cernea | |
| 7,983,079 B2 | 7/2011 | Kim | |
| 8,223,556 B2 | 7/2012 | Dutta et al. | |
| 8,228,729 B2 | 7/2012 | Liu et al. | |
| 8,228,741 B2 | 7/2012 | Li et al. | |
| 8,395,945 B2 | 3/2013 | Mokhlesi | |
| 8,472,257 B2 | 6/2013 | Dong et al. | |
| 8,553,466 B2 | 10/2013 | Han et al. | |
| 8,559,235 B2 * | 10/2013 | Yoon .................. | G11C 16/0483 365/185.18 |
| 8,605,519 B2 * | 12/2013 | Sung ........................ | G06F 1/10 365/185.17 |
| 8,654,587 B2 | 2/2014 | Yoon et al. | |

(Continued)

FOREIGN PATENT DOCUMENTS

KR    1020100056860 A    5/2010

*Primary Examiner* — Trong Phan
(74) *Attorney, Agent, or Firm* — Volentine & Whitt, PLLC

(57) ABSTRACT

A method of programming a nonvolatile memory device is provided which includes applying a program voltage to selected ones of a plurality of memory cells; applying a selected one of a plurality of verification voltages after precharging bit lines connected to memory cells to which the program voltage is applied; sensing the memory cells to which the selected verification voltage is applied; selecting memory cells programmed to a target state referring to the sensing result and target state data; and determining whether programming of the selected memory cells is passed or failed.

20 Claims, 20 Drawing Sheets

(56) References Cited

U.S. PATENT DOCUMENTS

| | | | | |
|---|---|---|---|---|
| 8,687,423 B2* | 4/2014 | Yoo | ............... | G11C 16/32 365/185.12 |
| 8,705,287 B2* | 4/2014 | Aritome | ............... | G11C 16/06 365/185.12 |
| 8,760,919 B2* | 6/2014 | Song | ............... | G11C 16/04 365/185.17 |
| 8,773,916 B2* | 7/2014 | Kim | ............... | G11C 16/0483 365/185.18 |
| 8,830,763 B2* | 9/2014 | Seo | ............... | G11C 16/0483 365/185.22 |
| 8,879,318 B2* | 11/2014 | Ahn | ............... | G11C 16/0483 365/185.22 |
| 8,971,109 B2* | 3/2015 | Noh | ............... | G11C 11/5635 365/185.29 |
| 8,971,116 B1* | 3/2015 | Lim | ............... | G11C 16/28 365/185.22 |
| 8,976,599 B2* | 3/2015 | Lee | ............... | G11C 11/5628 365/185.22 |
| 9,013,923 B2* | 4/2015 | Park | ............... | G11C 16/10 365/185.17 |
| 9,053,978 B2* | 6/2015 | Nam | ............... | H01L 27/11556 |
| 9,129,696 B2* | 9/2015 | Joo | ............... | G11C 16/26 |
| 2011/0233648 A1 | 9/2011 | Seol et al. | | |
| 2013/0132644 A1 | 5/2013 | Choi et al. | | |
| 2013/0163331 A1 | 6/2013 | Yoo et al. | | |

* cited by examiner

Default State Ordering

| | E | P1 | P2 | P3 | P4 | P5 | P6 | P7 |
|---|---|---|---|---|---|---|---|---|
| DL1 | 1 | 1 | 1 | 0 | 0 | 0 | 0 | 1 |
| DL2 | 1 | 1 | 0 | 0 | 1 | 1 | 0 | 0 |
| DL3 | 1 | 0 | 0 | 0 | 0 | 1 | 1 | 1 |
| # of dump | – | 5 | 4 | 3 | 4 | 5 | 4 | 5 |

Reordering

Sequential-Binary Code State Ordering

| | E | P1 | P2 | P3 | P4 | P5 | P6 | P7 |
|---|---|---|---|---|---|---|---|---|
| DL1 | 1 | 1 | 1 | 1 | 0 | 0 | 0 | 0 |
| DL2 | 1 | 1 | 0 | 0 | 1 | 1 | 0 | 0 |
| DL3 | 1 | 0 | 1 | 0 | 1 | 0 | 1 | 0 |
| # of dump | – | 3 | 3 | 2 | 3 | 2 | 2 | 1 |

FIG. 6A

| | E0 | P1 | P2 | P3 | P4 | P5 | P6 | P7 |
|---|---|---|---|---|---|---|---|---|
| DL1 | 1 | 1 | 1 | 0 | 0 | 0 | 0 | 1 |
| DL2 | 1 | 1 | 0 | 0 | 1 | 1 | 0 | 0 |
| DL3 | 1 | 0 | 0 | 0 | 0 | 1 | 1 | 1 |

Target → P1

FIG. 6B

| | E0 | P1 Target | P2 | P3 | P4 | P5 | P6 | P7 Selection |
|---|---|---|---|---|---|---|---|---|
| SL initial state | 0 | 0 | 0 | 0 | 0 | 0 | 0 | 0 |
| SL dump(①) | 0 | 1 | 1 | 1 | 1 | 0 | 0 | 0 |
| SL dump(②) | 0 | 1 | 0 | 0 | 1 | 0 | 0 | 0 |
| SL dump(③) | 0 | 1 | 0 | 0 | 0 | 0 | 0 | 0 |
| DL3 dump | – | 0→1 | – | – | – | – | – | – |
| SL sensing | – | 1 | – | – | – | – | – | – |
| DL3 dump | – | 1→0 | – | – | – | – | – | – | of dump = 5

Time →

FIG. 7A

| | E0 | P1 | P2 | P3 | P4 | P5 | P6 | P7 |
|---|---|---|---|---|---|---|---|---|
| | | ↑Target | | | | | | |
| DL1 | 1 | 1 | 1 | 1 | 0 | 0 | 0 | 0 |
| DL2 | 1 | 1 | 0 | 0 | 1 | 1 | 0 | 0 |
| DL3 | 1 | 0 | 1 | 0 | 1 | 0 | 1 | 0 |

FIG. 7B

| | E0 | P1 ←Target | P2 | P3 | P4 | P5 | P6 | P7 | |
|---|---|---|---|---|---|---|---|---|---|
| SL initial state | 0 | 0 | 0 | 0 | 0 | 0 | 0 | 0 | |
| SL sensing | 0 | 1 | 1 | 1 | 1 | 1 | 1 | 1 | |
| SL dump(①) | 0 | 1 | 1 | 1 | 0 | 0 | 0 | 0 | Selection |
| SL dump(②) | 0 | 1 | 0 | 0 | 0 | 0 | 0 | 0 | Selection |
| DL3 dump(③) | - | 0→1 | - | - | - | - | - | - | | of dump = 3

FIG. 8A

| | E0 | P1 | P2 | P3 | P4 | P5 | P6 | P7 |
|---|---|---|---|---|---|---|---|---|
| DL1 | 1 | 1 | 1 | 1 | 0 | 0 | 0 | 0 |
| DL2 | 1 | 1 | 0 | 0 | 1 | 1 | 0 | 0 |
| DL3 | 1 | 0 | 1 | 0 | 1 | 0 | 1 | 0 |

Target → P3

FIG. 8C

| | E0 | P1 | P2 | P3 | P4 | P5 | P6 | P7 | |
|---|---|---|---|---|---|---|---|---|---|
| SL initial state | 0 | 0 | 0 | 0 | 0 | 0 | 0 | 0 | |
| SL sensing | 0 | 0 | 1 | 1 | 1 | 1 | 1 | 1 | |
| SL dump (①) | 0 | 0 | 0 | 1 | 0 | 0 | 0 | 0 | } Selection |
| DL2 dump (②) | - | - | 0→1 | - | - | - | - | - | |
| DL2, 3 dump (③) | - | - | - | 0→1 | - | - | - | - | |

Target → P3

\# of dump = 2

Time →

NONVOLATILE MEMORY DEVICE AND OPERATING METHOD THEREOF

CROSS-REFERENCE TO RELATED APPLICATIONS

A claim for priority under 35 U.S.C. §119 is made to Korean Patent Application No. 10-2014-0093320 filed Jul. 23, 2014, in the Korean Intellectual Property Office, the entire contents of which are hereby incorporated by reference.

BACKGROUND

The inventive concepts described herein relate to a verification method of a nonvolatile memory device.

A semiconductor memory device is volatile or nonvolatile. A volatile semiconductor memory device supports fast read and write speeds, while it loses contents stored therein when powered off. A nonvolatile semiconductor memory device retains contents stored therein, although its power is cut off. The nonvolatile semiconductor memory device, thus, is used to store data to be retained regardless of whether a power is supplied to the nonvolatile semiconductor memory device.

A flash memory device is a typical nonvolatile memory device. the flash memory device is widely used as voice and image data storing mediums of information devices, such as a solid state drive (SSD), a computer, a handheld phone, a smart phone, a digital camera, a camcorder, a voice recorder, an MP3 player, a personal digital assistant (PDA), a handheld PC, a game machine, a facsimile, a scanner, and a printer. Research on high-capacity, high-input/output, and low-power techniques of the nonvolatile memory device has been made for the past several years to mount it on mobile devices, such as the SSD and the smart phone.

A plurality of program loops may be executed to store a plurality of data bits at a memory cell, and a verification operation may be performed with respect to each program state every program loop. Thus, it is essential to shorten a program verification time in order to reduce a program time.

SUMMARY

One aspect of embodiments of the inventive concept is directed to provide a method of programming a nonvolatile memory device, the method comprising applying a program voltage to selected ones of a plurality of memory cells; applying a selected one of a plurality of verification voltages after pre-charging bit lines connected to memory cells to which the program voltage is applied; sensing the memory cells to which the selected verification voltage is applied; selecting memory cells programmed to a target state referring to the sensing result and target state data; and determining whether programming of the selected memory cells is passed or failed.

In exemplary embodiments, the selecting includes excluding upper states having a threshold voltage higher than the target state by dumping at least one bit of state data stored in data latches, at a sense latch.

In exemplary embodiments, the programming method further comprises dumping the data latches with a reference data bit such that the target memory cells are inhibited.

In exemplary embodiments, the state data is set according to an ordering with the form of a sequential binary code.

In exemplary embodiments, the programming method further comprises initializing a value of the sense latch before the pre-charging.

In exemplary embodiments, the data latches are dumped with the reference data bit such that memory cells programmed to a threshold voltage lower than the target state and sensed to be an off-cell are inhibited.

In exemplary embodiments, at least one bit of the state data is dumped into the sense latch such that memory cells which is programmed to a threshold voltage higher than the target state but of which the programming is not completed are not inhibited.

In exemplary embodiments, an ordering of state data in the programming is different from that of state data provided as a default value.

In exemplary embodiments, the programming method further comprises reordering the state data provided as the default value into the form of the sequential binary code before the programming.

In exemplary embodiments, an ordering of state data in the programming is equal to that of state data provided as a default value.

Another aspect of embodiments of the inventive concept is directed to provide a nonvolatile memory device comprising a memory cell array including a plurality of memory cells; a page buffer block including page buffers connected to a plurality of bit lines connected with the plurality of memory cells, respectively; and control logic configured to apply a program voltage to selected ones of the plurality of memory cells, apply a selected one of a plurality of verification voltages after pre-charging bit lines connected to memory cells to which the program voltage is applied, control the page buffers such that a sensing operation is performed with respect to memory cells to which the selected verification voltage is applied, and control the page buffers referring to the sensing result and target state data such that memory cells programmed to a target state are selected.

In exemplary embodiments, each of the page buffers includes a plurality of data latches configured to store state data corresponding to a state to be programmed at a program operation; a cache latch configured to receive program data from an external device to transfer the input program data to the plurality of data latches, at the program operation; a pre-charge circuit configured to apply a pre-charge voltage to the bit lines, before the sensing operation; and a sense latch configured to store sensing data by latching a voltage of a bit line according to the sensing operation.

In exemplary embodiments, the control logic is further configured to select the target state by dumping at least one bit of data stored in the data latches into the sense latch.

In exemplary embodiments, the state data is reordered into the form of a sequential binary code under a control of the control logic.

In exemplary embodiments, the control logic is further configured to dump the data latches with a reference data bit such that memory cells programmed to a threshold voltage lower than the target state and sensed to be an off-cell are dumped with the reference data bit and to dump the sense latch with at least one bit of the state data such that memory cells which is programmed to a threshold voltage higher than the target state but of which the programming is not completed are not inhibited.

Still another aspect of embodiments of the inventive concept is directed to provide a method of programming a nonvolatile memory device which includes a plurality of page buffers, each of which has a sense latch and a plurality of data latches, the method comprising applying a program voltage to selected ones of a plurality of memory cells; applying a selected one of a plurality of verification voltages after pre-charging bit lines connected to memory cells to which the program voltage is applied; sensing the memory cells to which the selected verification voltage is applied; selecting memory cells programmed to a target state referring to the sensing result stored in the sense latch and target state data; and determining whether programming of the selected memory cells is passed or failed, based on the sensing result.

In exemplary embodiments, the selecting includes excluding upper states having a threshold voltage higher than the target state by dumping at least one bit of state data stored in data latches, at a sense latch.

In exemplary embodiments, the programming method further comprises dumping the data latches with a reference data bit such that the target memory cells are inhibited.

In exemplary embodiments, the state data is binary code that is arranged in an ascending order or a descending order.

In exemplary embodiments, the data latches are dumped with the reference data bit such that memory cells programmed to a threshold voltage lower than the target state and sensed to be an off-cell are inhibited.

BRIEF DESCRIPTION OF THE FIGURES

The above and other objects and features will become apparent from the following description with reference to the following figures, wherein like reference numerals refer to like parts throughout the various figures unless otherwise specified, and wherein

FIGS. 6A and 6B are diagrams for describing a dumping operation between a sense latch and data latches at a general verification operation;

FIGS. 7A and 7B are diagrams for describing a dumping operation between a sense latch and data latches at a verification operation according to an embodiment of the inventive concept;

FIGS. 8A through 8C are diagrams for describing a dumping operation between a sense latch and data latches at a verification operation according to another embodiment of the inventive concept;

DETAILED DESCRIPTION

Figure 1:
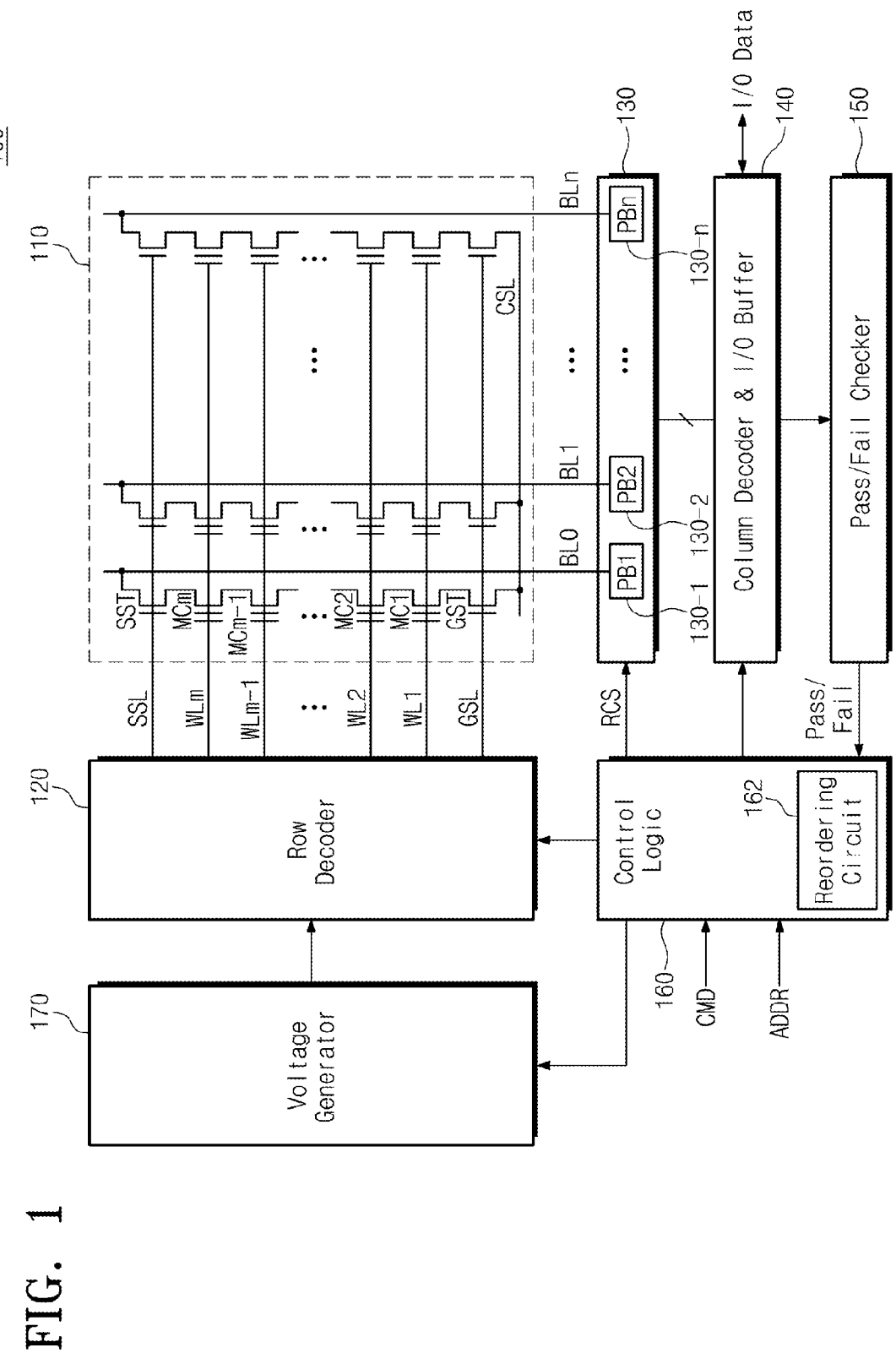
FIG. 1 is a block diagram schematically illustrating a nonvolatile memory device according to an embodiment of the inventive concept.

Embodiments will be described in detail with reference to the accompanying drawings. The inventive concept, however, may be embodied in various different forms, and should not be construed as being limited only to the illustrated embodiments. Rather, these embodiments are provided as examples so that this disclosure will be thorough and complete, and will fully convey the concept of the inventive concept to those skilled in the art. Accordingly, known processes, elements, and techniques are not described with respect to some of the embodiments of the inventive concept. Unless otherwise noted, like reference numerals denote like elements throughout the attached drawings and written description, and thus descriptions will not be repeated. In the drawings, the sizes and relative sizes of layers and regions may be exaggerated for clarity.

It will be understood that, although the terms "first", "second", "third", etc., may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the inventive concept.

Spatially relative terms, such as "beneath", "below", "lower", "under", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" or "under" other elements or features would then be oriented "above" the other elements or features. Thus, the exemplary terms "below" and "under" can encompass both an orientation of above and below. The device may be otherwise oriented (rotated 90 degrees or at other orientations) and the spatially relative descriptors used herein interpreted accordingly. In addition, it will also be understood that when a layer is referred to as being "between" two layers, it can be the only layer between the two layers, or one or more intervening layers may also be present.

The terminology used herein is for the purpose of describing particular embodiments only and is not intended to be limiting of the inventive concept. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Also, the term "exemplary" is intended to refer to an example or illustration.

It will be understood that when an element or layer is referred to as being "on", "connected to", "coupled to", or "adjacent to" another element or layer, it can be directly on, connected, coupled, or adjacent to the other element or layer, or intervening elements or layers may be present. In contrast, when an element is referred to as being "directly on," "directly connected to", "directly coupled to", or "immediately adjacent to" another element or layer, there are no intervening elements or layers present.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and/or the present specification and will not be interpreted in an idealized or overly formal sense unless expressly so defined herein.

In an embodiment of the present inventive concept, a three dimensional (3D) memory array is provided. The 3D memory array is monolithically formed in one or more physical levels of arrays of memory cells having an active area disposed above a silicon substrate and circuitry associated with the operation of those memory cells, whether such associated circuitry is above or within such substrate. The term "monolithic" means that layers of each level of the array are directly deposited on the layers of each underlying level of the array.

In an embodiment of the present inventive concept, the 3D memory array includes vertical NAND strings that are vertically oriented such that at least one memory cell is located over another memory cell. The at least one memory cell may comprise a charge trap layer. Each vertical NAND string may include at least one select transistor located over memory cells, the at least one select transistor having the same structure with the memory cells and being formed monolithically together with the memory cells.

The following patent documents, which are hereby incorporated by reference, describe suitable configurations for three-dimensional memory arrays, in which the three-dimensional memory array is configured as a plurality of levels, with word lines and/or bit lines shared between levels: U.S. Pat. Nos. 7,679,133; 8,553,466; 8,654,587; 8,559,235; and US Pat. Pub. No. 2011/0233648.

FIG. 1 is a block diagram schematically illustrating a nonvolatile memory device according to an embodiment of the inventive concept. Referring to FIG. 1, a nonvolatile memory device 100 contains a memory cell array 110, a row decoder 120, a page buffer block 130, a column decoder and input/output buffer block 140, a pass/fail checker 150, control logic 160, and a voltage generator 170.

The memory cell array 110 includes a plurality of blocks. For the sake of easy understanding, one memory block is illustrated in FIG. 1. The memory block includes strings connected to a plurality of bit lines BL1 through BLn, respectively. Here, the string has a string selection transistor SST, a plurality of memory cells MC1 through MCm, and a ground selection transistor GST which are connected in series. In each string, the string selection transistor SST is driven with a voltage transferred through a string selection line SSL, and the ground selection transistor GST is driven with a voltage transmitted through a ground selection line GSL. The memory cells MC1 through MCm are driven with voltages transmitted through corresponding word lines WL1 through WLm. Each memory cell may store one or more data bits.

The row decoder 120 selects one of the memory blocks in response to a row address from the control logic 160. The row decoder 120 transfers word line voltages for driving to the word lines WL1 through WLm: including a program voltage, a pass voltage, an erase voltage, a verification voltage, a read voltage, and a read pass voltage.

The page buffer block 130 acts as a write driver or a sense amplifier according to an operating mode. For example, the page buffer block 130 acts as the sense amplifier at a read operation and the write driver at a write operation. The page buffer block 130 includes a plurality of page buffers including page buffer PB1 130-1, page buffer PB2 130-2 through page buffer PBn 130-$n$ corresponding to the bit lines BL1 through BLn, respectively.

Each of the page buffers PB1 through PBn contains a plurality of latches. For example, the plurality of latches may include a sense latch, a cache latch, and data latches. At a read/verification operation, the sense latch may store data corresponding to a state to be sensed before a sensing operation, or it may store data read out from a memory cell after the sensing operation. At a program operation, the cache latch may temporarily store data stored in the data latches. Stored in the data laches is state data that indicates a state to be programmed at the program operation.

The column decoder and input/output buffer block 140 selects page buffers of the page buffer block 130 in response to a column address. At a program operation, a selected page buffer stores program bits that are provided through the column decoder and input/output buffer block 140. At a read operation, data from a selected page buffer is output to an external device through the column decoder and input/output buffer block 140. At a verification operation, the column decoder and input/output buffer block 140 provides sensed data to the pass/fail checker 150.

The pass/fail checker 150 determines whether programming of the selected memory cell is passed, based on the sensed data from the column decoder and input/output buffer block 140. If a result of the verification operation indicates that a threshold voltage of the selected memory is over a target voltage, the pass/fail checker 150 may transfer a pass signal to the control logic 160. If a result of the verification operation indicates that a threshold voltage of the selected memory is below a target voltage, the pass/fail checker 150 may transfer a fail signal to the control logic 160.

The control logic 160 controls an overall operation of the nonvolatile memory device 100 in response to a command CMD and an address ADDR. For example, the control logic 160 controls the voltage generator 170 such that voltages for driving are generated and controls the row decoder 120 such that the voltages thus generated are transferred to word lines WL1 through WLm. The control logic 160 controls the column decoder and input/output buffer block 140 to input and output page data to be programmed and read page data.

The control logic 160 includes a reordering circuit 162. The reordering circuit 162 provides the page buffer block 130 with a reordering control signal RCS for controlling a change in state-data ordering. To reduce the number of dumping operations performed in a page buffer at a verification operation, state data stored in data latches of the page buffers PB1 through PBn is newly ordered according to the reordering control signal RCS.

In a general verification operation, a target memory cell to be programmed to a target state is selected by deciding the target state corresponding to a sensing target, and then a sensing operation is performed through a bit line connected to the target memory cell. In embodiments of the inventive concept, however, a target state and a target memory cell corresponding to the target state are selected after a sensing operation is performed with respect to programmed memory cells in a lump. Whether programming of the target memory cell is passed or failed is checked, thereby resulting in a decrease in the number of dumping operations performed in the page buffers PB1 through PBn. This means that programming speed is improved.

The voltage generator 170 produces voltages, including a program voltage, a verification voltage, a pass voltage, and a read voltage, according to a control of the control logic 160.

Figure 2:
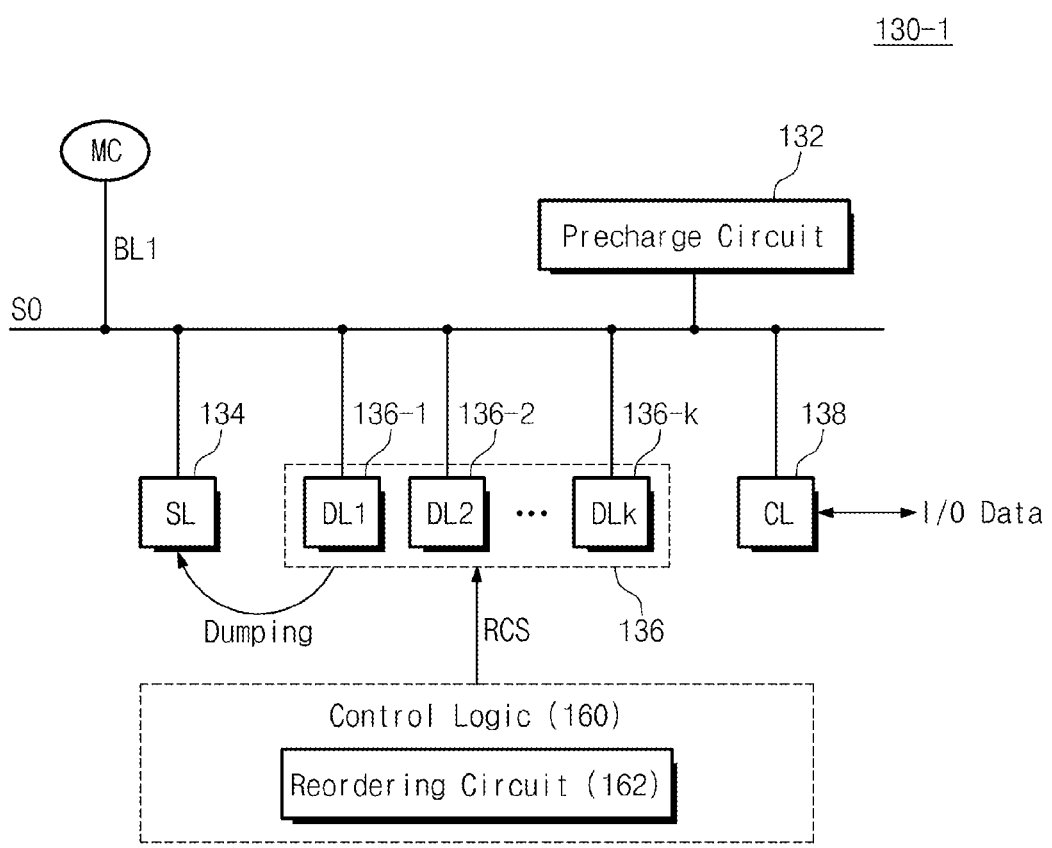
FIG. 2 is a diagram schematically illustrating a page buffer shown in FIG. 1.

FIG. 2 is a diagram schematically illustrating a page buffer shown in FIG. 1. Shown in FIG. 2 is only one page buffer 130-1. However, remaining page buffers of a page buffer block 130 have the same structure as shown in FIG. 2. Referring to FIG. 2, the page buffer 130-1 contains a pre-charge circuit 132, at least one sense latch 134, data latches 136-1 through 136-$k$, and at least one cache latch 138.

The pre-charge circuit 132 provides a selected bit line with a pre-charge voltage at a sensing operation of a read or verification operation. The pre-charge circuit 132 is connected with a memory cell MC through a bit line BL1.

Prior to a sensing operation, the sense latch 134 stores data indicating whether the memory cell MC becomes a sensing target, that is, data indicating selection of the bit line BL1. Or, after the sensing operation, the sense latch 134 stores data programmed at the memory cell MC connected to the bit line BL, by sensing a voltage of a sensing node SO and latching the sensed voltage.

At a program operation, the data latches 136-1 through 136-$k$ store state data indicating a state to be programmed at a memory cell. In exemplary embodiments, the number of states to be programmed is ($2^k$–1). When 3-bit data is stored at a memory cell MC, for example, the number of states to be programmed is 7.

At a program operation, the cache latch 138 receives data from an external device and transfers the received data to the data latches 136-1 through 136-$k$.

In a general verification operation, state data stored in the data latches 136-1 through 136-$k$ is sequentially dumped into the sense latch 134, and control logic 160 determines whether a programmed memory cell is a target memory cell corresponding to a verification target, based on a value dumped into the sense latch 134. If the determination result indicates that the programmed memory cell is the target memory cell, a sensing operation on the target memory cell is performed to determine whether programming of the target memory cell is passed or failed.

With embodiments of the inventive concept, however, during a programming step prior to a verification step, the control logic 160 provides the page buffer 130-1 with a reordering control signal RCS for changing the ordering of state data with a default value. The state data stored in the data latches 136-1 through 136-$k$ may be reordered according to the reordering control signal RCS. The reordered state data may be state data with the form of a sequential binary code. The sequential binary code is a binary code of which the values are arranged in an ascending order or a descending order when it is converted into a decimal number. If programming of the memory cell MC with the reordered state data ends, a verification operation may be performed. With embodiments of the inventive concept, however, when a program operation is performed by means of state data with the form of the sequential binary code set to a default value, the step of reordering the state data may not be carried out.

Performed en bloc is a sensing operation with respect to programmed memory cells in a lump. Information on a sensing result (i.e., information indicating whether a verified memory cell is an on-cell or an off-cell) is stored in the sense latch 134. After the sensing operation, state data stored in the data latches 136-1 through 136-$k$ is sequentially dumped into the sense latch 134. The control logic 160 selects a target cell corresponding to a verification target, referring to a value dumped into the sense latch 134. A pass/fail checker 150 (refer to FIG. 1) determines whether programming of the memory cell MC is passed or failed.

With embodiments of the inventive concept, the number of dumping operations is reduced at a verification operation on a memory cell by selecting a sensing target after a sensing operation is performed with respect to programmed memory cells in a lump, thereby improving programming speed.

Figure 3:
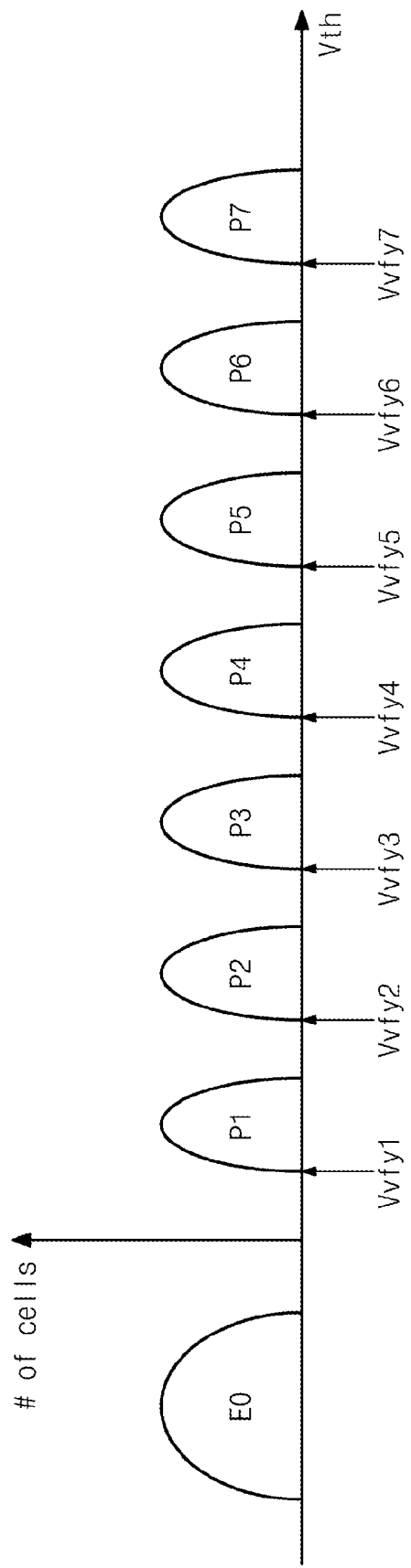
FIG. 3 is a diagram schematically illustrating threshold voltage distributions of memory cells, according to an embodiment of the inventive concept.

FIG. 3 is a diagram schematically illustrating threshold voltage Vth distributions of memory cells, according to an embodiment of the inventive concept. Illustrated in FIG. 3 is an embodiment where 3-bit data is programmed at each memory cell. Referring to FIG. 3, a memory cell is programmed to have one of eight states E0 and P1 through P7. In FIG. 3, voltages Vvfy1 through Vvfy7 are verification voltages that are used to verify the states P1 through P7.

Figure 4:
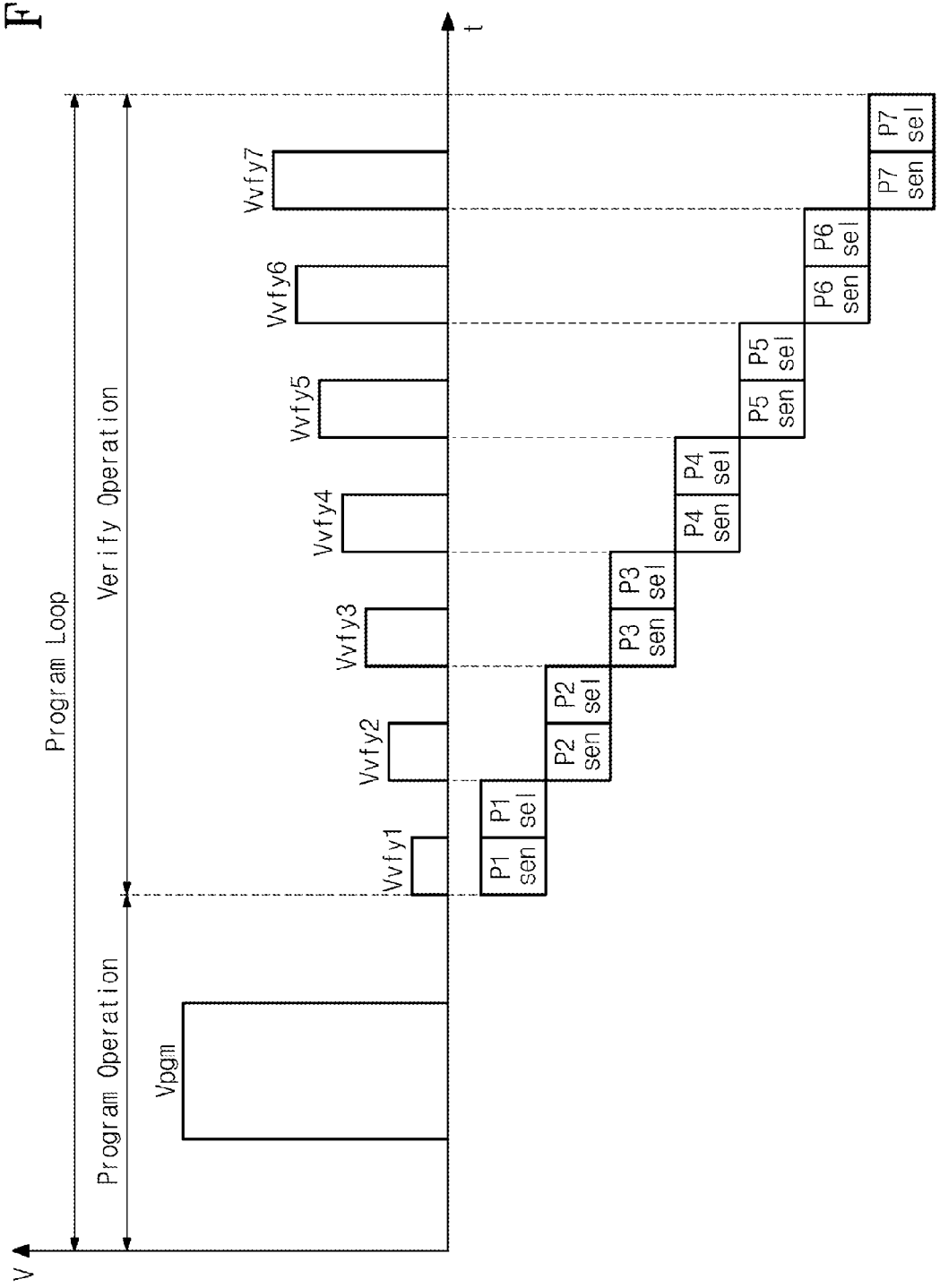
FIG. 4 is a diagram schematically illustrating a program loop according to an embodiment of the inventive concept.

FIG. 4 is a diagram schematically illustrating a program loop according to an embodiment of the inventive concept. Referring to FIG. 4, a program loop includes a program operation and a verification operation. A program voltage Vpgm is applied to a memory cell at the program operation, and verification voltages Vvfy1 through Vvfy7 are applied to the memory cell at the verification operation. Programming may be made in an ISPP (Incremental Step Pulse Programming) way.

A verification-operation period is divided into a plurality of period where the states P1 through P7 are verified. Each of the periods is formed of a sensing period, in which a sensing operation is performed, and a selection period in which a state corresponding to a verification target is selected.

With embodiments of the inventive concept, unlike a general verification operation where a sensing operation is performed after a state corresponding to a verification target is selected, a state corresponding to a verification target is selected after a sensing operation is carried out with respect to programmed memory cells in a lump. Moreover, the ordering of state data is changed in the program period to reduce the number of dumping operations that are executed while the state corresponding to the verification target is selected, thereby improving programming speed.

Figure 5:
FIG. 5 is a table schematically illustrating the ordering of state data according to an embodiment of the inventive concept and the general ordering of state data.

FIG. 5 is a table schematically illustrating the ordering of state data according to an embodiment of the inventive concept and the general ordering of state data and the number of dumping operations (# of dumps). State data with a default ordering (Default State Ordering) may be provided as a default value, and state data stored in data latches may be reordered (Reordering) into state data with the form of a sequential binary code (Sequential-Binary Code State Ordering) at a program operation. The term "sequential" means that data is arranged in an ascending order or a descending order when reordered state data is changed into a decimal number. Referring to FIG. 5, when reordered, state data corresponding to states E0 and P1 through P7 may be arranged in a descending order from 8 to 1.

Figure 6A:
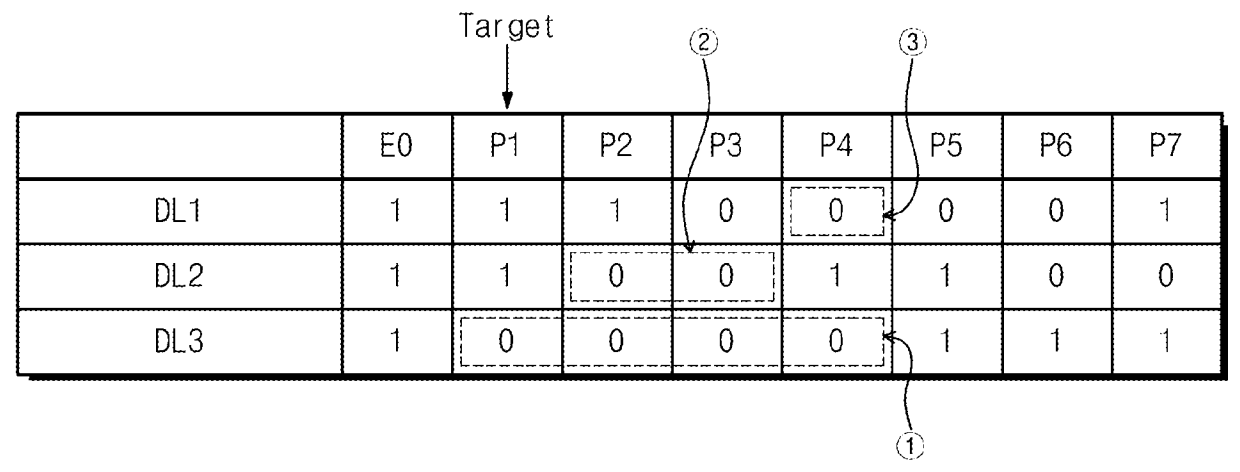

FIGS. 6A and 6B are diagrams for describing a dumping operation between a sense latch and data latches at a general verification operation with respect to time (Time). It is assumed that a memory cell stores 3-bit data and a target state corresponding to a verification target is P1.

Referring to FIGS. 6A and 6B, if a verification operation begins, sense latches of page buffers connected to programmed memory cells may be initialized to '0' through bit lines (SL initial state).

Performed is an operation of selecting a state P1 corresponding to a sensing target after the sense latches are initialized. Values of sense latches of page buffers, in which a bit value stored in a data latch DL3 is '0', from among page buffers connected with the programmed memory cells are dumped with '1' (①) (SL dump (①)). Values of sense latches of page buffers, in which a bit value stored in a data latch DL2 is '0', from among page buffers connected with the programmed memory cells are dumped with '0' (②) (SL dump (②)). Afterwards, values of sense latches of page buffers, in which a bit value stored in a data latch DL1 is '0', from among page buffers connected with the programmed memory cells are dumped with '0' (③) (SL dump (③)). A target state P1 corresponding to a sensing target is selected through the above-described steps (Selection).

An inhibit dump operation is carried out to inhibit memory cells programmed to a target state (DL3 dump). That is, state data of page buffers in which state data '110' corresponding to the target state P1 is stored may be changed into reference data '111'. In case of the P1 state, a value of the data latch DL3 is dumped with '1'.

A sensing operation is performed (SL sensing). The sensing operation is performed with respect to memory cells programmed to the target state P1. This may mean that the sensing operation is only performed with respect to memory cells connected with page buffers where a value of a sense latch is '1'. A sensing result indicates whether the sensed memory cell is an on-cell or an off-cell, and '1' or '0' is stored in the sense latch. Whether programming of the sensed memory cell is passed or failed is determined according to the value stored in the sense latch.

After the sensing operation there is performed step where restoring into original state data is carried out with respect to a page buffer where inhibit dumping has been made. The restoring into original state data may be performed with respect to a page buffer connected to a memory cell that is determined as an on-cell. In this case, a value of a data latch DL3 is restored into '0' from '1' (DL3 dump).

As described above, a dumping operation is performed five times (# of dump=5) to verify whether a memory cell is programmed to a P1 state. Illustrated in FIG. 5 is the number of dumping operations (# of dump) executed with respect to other program states P2 through P7.

Figure 7A:
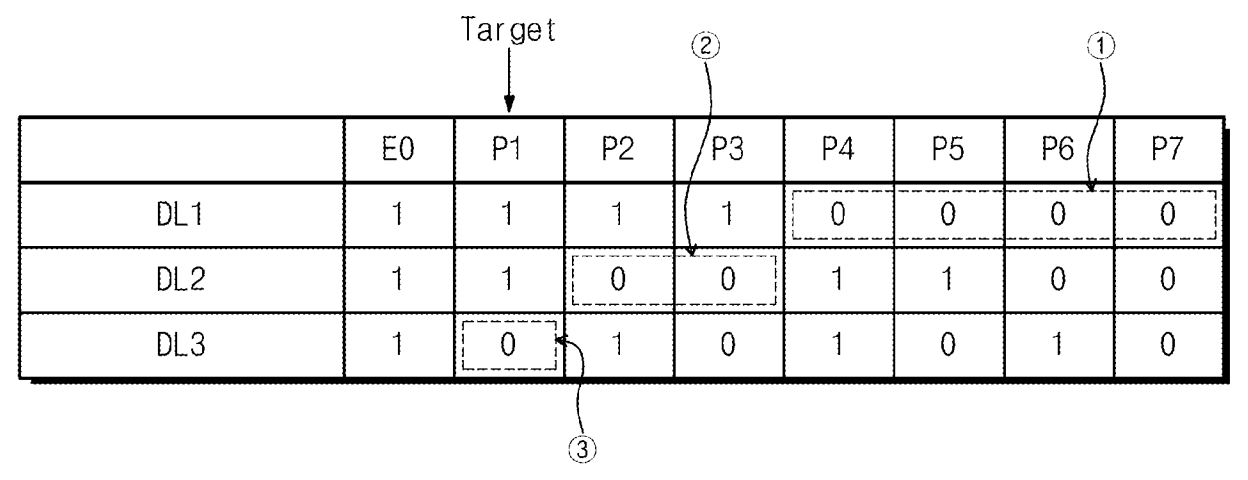

FIGS. 7A and 7B are diagrams for describing a dumping operation between a sense latch and data latches at a verification operation with respect to time (Time) according to an embodiment of the inventive concept. A program loop includes a program operation and a verification operation. Prior to programming, state data with a default value is reordered as illustrated in FIG. 7A. Alternatively, reordering is not performed when state data with the form of a sequential binary code is set to a default value.

If a verification operation begins, sense latches of page buffers connected to programmed memory cells are initialized to '0' through bit lines (SL initial state).

A sensing operation (SL sensing) is carried out after initialization of the sense latches. The inventive concept is different from a general method where a sensing operation is performed after a state corresponding to a verification target is selected (Selection), in that a state corresponding to a verification target is selected for a verification operation after a sensing operation is carried out with respect to programmed memory cells in a lump. '0' is stored in a sense latch when a sensing result indicates that a sensed memory cell is an on-cell; on the other hand, '1' is stored in a sense latch when a sensing result indicates that a sensed memory cell is an off-cell.

An operation of selecting a target state P1 corresponding to a sensing target is performed after the sensing operation. First, values of sense latches of page buffers, in which a bit value stored in a data latch DL1 is '0', from among page buffers connected with the programmed memory cells are dumped with '0' (①) (SL dump (①)). Next, values of sense latches of page buffers, in which a bit value stored in a data latch DL2 is '0', from among page buffers connected with the programmed memory cells are dumped with '0' (②) (SL dump (②)). Upper states P2 through P7 of the target state P1 are excluded through the above-described steps. That is, sense latches of page buffers in which state data of the target state P1 is stored are only set with '1'. Program pass or program fail is finally determined using values of sense latches of page buffers where state data of the target state P1 is stored.

An inhibit dump operation is carried out to inhibit memory cells programmed to the target state P1. That is, state data of page buffers in which state data '110' corresponding to the target state P1 is stored may be changed into reference data '111'. In case of the P1 state, a value of the data latch DL3 is dumped with '1' (DL3 dump (③)).

With the above description, dumping is made three times (3 of dump=3) to verify programming into the P1 state.

With embodiments of the inventive concept, memory cells are programmed with state data having the form of a sequential binary code. The state data having the form of the sequential binary code may be a default value. Being not a default value, the state data with the form of the sequential binary code may be reordered before a program operation. Unlike a general verification operation, after a sensing operation is performed, a target state is selected for a verification operation, thereby resulting in a decrease in the number of dumping operations to be executed while a target state is selected. This means that programming speed is improved.

Figure 8B:
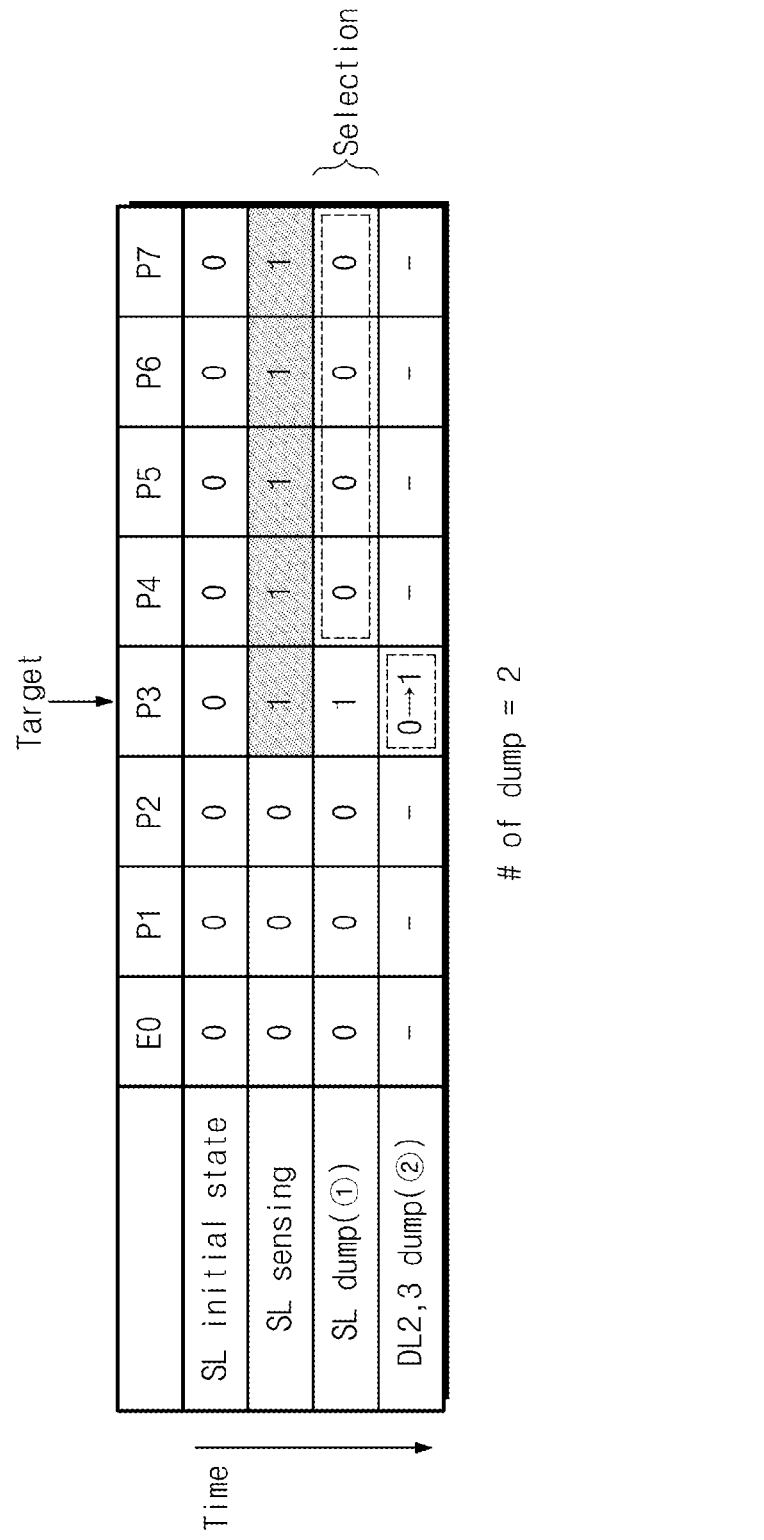

FIGS. 8A through 8C are diagrams for describing a dumping operation between a sense latch and data latches at a verification operation with respect to time (Time), according to another embodiment of the inventive concept. In FIGS. 8A through 8C, a dumping operation is similar to that described with reference to FIGS. 7A and 7B, and a duplicated description is thus omitted.

When adjacent bits of state data are '0', the number of dumping operations performed in a page buffer where the state data is store is further reduced. For example, P3, P6, and P7 states shown in FIG. 8A correspond to such a case.

Referring to FIGS. 8A and 8B, sense latches of page buffers connected to programmed memory cells are initialized to '0' through bit lines (SL initial state), after a sensing operation (SL sensing) is performed with respect to programmed memory cells in a lump, values of sense latches of page buffers in which a bit value stored in a data latch DL1 is '0' are dumped with '0' (①) (SL dump (①)) (Selection). Values of sense latches of page buffers in which bit values stored in data latches DL2 and DL3 are '0' are dumped with '0' (②) (DL2,3 dump (②)). Upper states P4 through P7 of a target state P3 are excluded through the above-described steps.

As described above, a dumping operation is performed two times (# of dump=2) to verify whether a memory cell is programmed to a P3 state. The number of dumping operations executed with respect to other program states is illustrated in FIG. 5.

However, a sensing result always is not desirable. For example, a memory cell that has a lower state (e.g., P2) below a verification level of the target state P3 can be sensed as an off-cell for certain reasons. An operating method on the above-described case is described with reference to FIG. 8C.

Referring to FIG. 8C, it is assumed that a target state is P3 and a sensing result in a sense latch of a page buffer where state data P2 is stored indicates an off-cell. This corresponds to a case where inhibiting must be made at a verification step on a lower state P2 but is not made. Below described is an operating method on a case where a sensing value of a sense latch of a page buffer where data of the lower state P2 is stored indicates an off-cell.

In this case, inhibit dumping is made with respect to not only page buffers of which the data latches store data of the target state P3 but page buffers where data of the lower state P2 is stored. Sense latches of page buffers connected to programmed memory cells are initialized to '0' through bit lines (SL initial state), and after a sensing operation (SL sensing) is performed with respect to programmed memory cells in a lump, first a sense latch is dumped (①) (SL dump (①)) (Selection). Next, a data latch DL2 of a page buffer where the state data P2 is stored is dumped with '1' (②) (DL2 dump (②)). Finally, data latches DL2 and DL3 of a page buffer where the state data P3 is stored are dumped with '1' (③) (DL2,3 dump (③)). A dumping operation is performed two times (# of dump=2). The dumping (②) and the dumping (③) are executed in different page buffers and at the same time.

Moreover, generated is a case where a lower state (e.g., P2) below a verification level of a target state P3 is not inhibited during a verification step on the P2 state and is sensed as an on-cell during a verification step on the P3 state. In exemplary embodiments, a memory cell corresponding to such a case is again programmed at a next program loop and experiences a verification operation.

Figure 9:
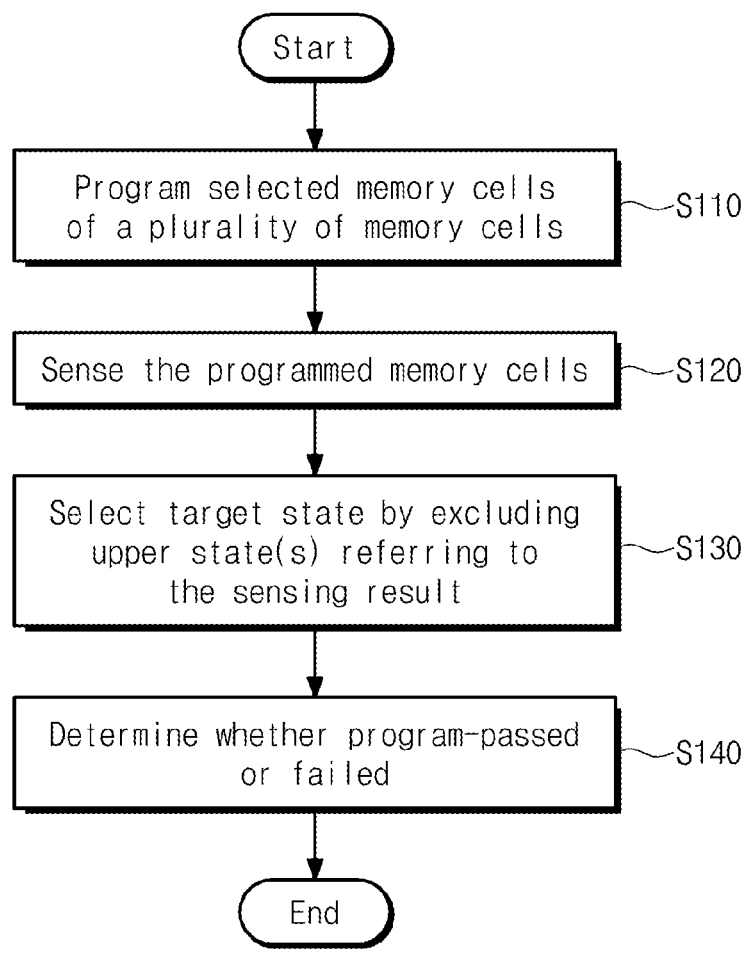
FIG. 9 is a flow chart schematically illustrating operations executed in a program loop, according to an embodiment of the inventive concept.

FIG. 9 is a flow chart schematically illustrating operations executed in a program loop, according to an embodiment of the inventive concept.

In step S110, a program operation is performed. The program operation is executed with respect to selected memory cells of a plurality of memory cells. Each memory cell may store a plurality of bits.

In step S120, a sensing operation is performed with respect to programmed memory cells. A sensing operation is carried out with respect to the programmed memory cells in a lump, unlike a general way where a sensing operation is performed with respect to target memory cells corresponding to a target state after the target state is determined.

In step S130, an operation of selecting a target state is performed by excluding upper states of the target state referring to a sensing result. The upper states may be excluded by dumping a sense latch according to values stored in data latches of a page buffer as described above.

In step S140, whether programming of memory cells is passed or failed is determined. A pass/fail checker 150 (refer to FIG. 1) determines program pass or program fail referring to a value dumped into a sense latch and sends the determination result to control logic 160 (refer to FIG. 1).

Figure 10:
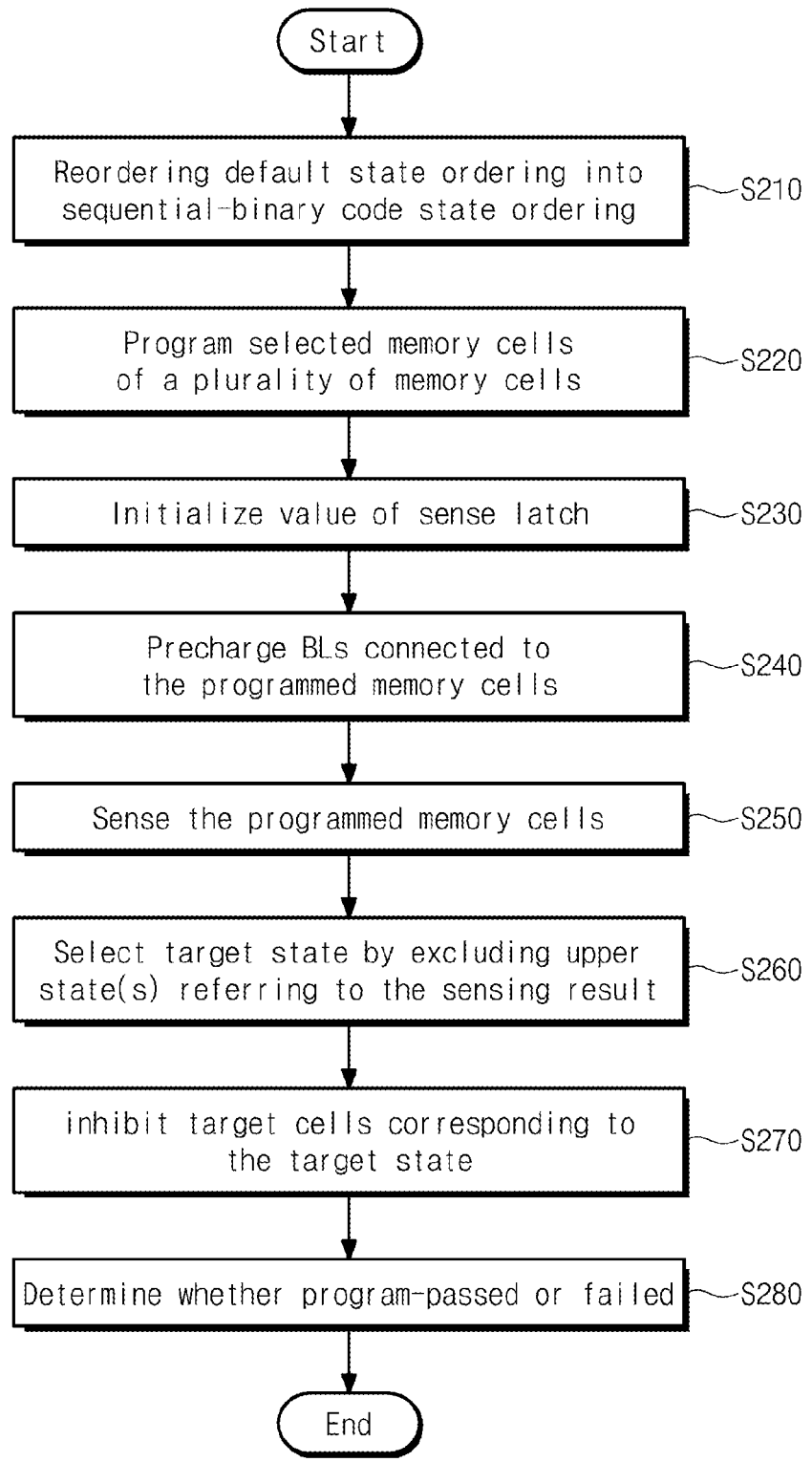
FIG. 10 is a flow chart schematically illustrating operations executed in a program loop, according to another embodiment of the inventive concept.

FIG. 10 is a flow chart schematically illustrating operations executed in a program loop, according to another embodiment of the inventive concept.

In step S210, reordering into state data with the form of a sequential binary code is made. This is executed when state data with a default value is different from reordered state data and is not executed when reordered state data is a default value.

In step S220, a program operation is performed. The program operation is executed with respect to selected memory cells of a plurality of memory cells. Each memory cell may store a plurality of bits.

In step S230, sense latches are initialized. For example, an initialization value is '0'.

In step S240, bit lines connected with programmed memory cells are pre-charged.

In step S250, a sensing operation is performed with respect to the programmed memory cells. A sensing operation is carried out with respect to the programmed memory cells in a lump, unlike a general way where a sensing operation is performed with respect to target memory cells corresponding to a target state after the target state is determined.

In step S260, a target state is selected by excluding upper states of the target state referring to a sensing result. The upper states may be excluded by dumping a sense latch according to values stored in data latches of a page buffer as described above.

In step S270, target cells corresponding to the target state are inhibited. This is to inhibit memory cells connected to page buffers where data corresponding to the target state is stored, in a next program loop. For example, inhibit dumping is made with respect to data latches where '0' is stored, to change all values in data latches into '1'.

In step S280, whether programming of memory cells is passed or failed is determined. A pass/fail checker 150 (refer to FIG. 1) determines program pass or program fail referring to a value dumped into a sense latch and sends the determination result to control logic 160 (refer to FIG. 1).

With embodiments of the inventive concept, memory cells are programmed with state data having the form of a sequential binary code. The state data having the form of the sequential binary code may be a default value. Being not a default value, the state data with the form of the sequential binary code may be reordered before a program operation. Unlike a general verification operation, after a sensing operation is performed, a target state is selected for a verification operation, thereby resulting in a decrease in the number of dumping operations to be executed while a target state is selected.

The inventive concept is applicable to VNAND.

Figure 11:
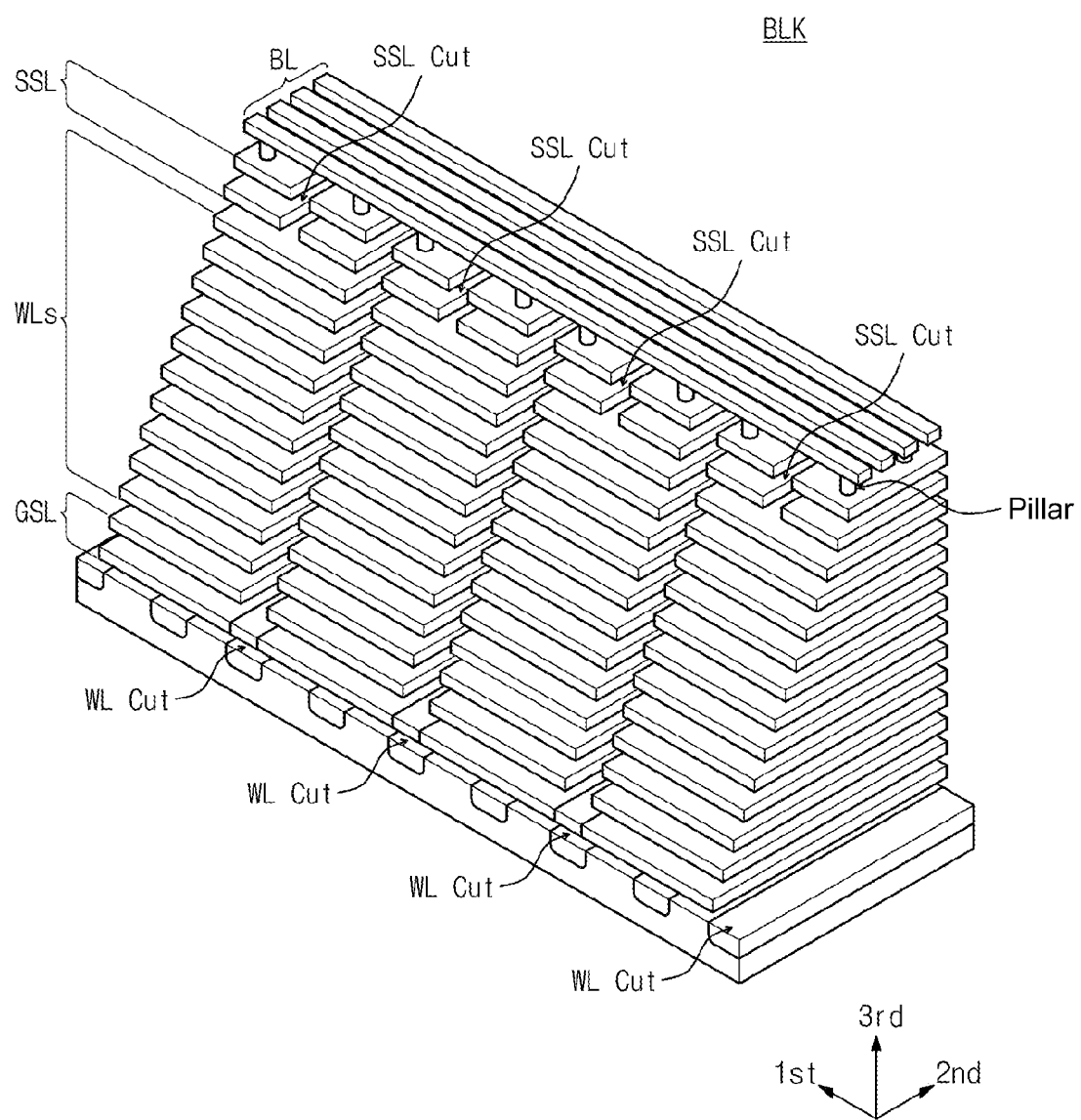
FIG. 11 is a perspective view of a block of VNAND according to an embodiment of the inventive concept.

FIG. 11 is a perspective view of a block of VNAND according to an embodiment of the inventive concept. Referring to FIG. 11, four sub blocks are formed on a substrate, wherein respective $1^{st}$, $2^{nd}$ and $3^{rd}$ directions are as shown. Each sub block is formed by stacking and cutting at least one ground selection line GSL, a plurality of word lines (WLs), and at least one string selection line SSL on the substrate in a plate shape.

The at least one string selection line SSL is separated by string selection line cuts (SSL Cut). Although not shown in FIG. 11, each word line cut may include a common source line CSL. In exemplary embodiments, the common source lines CSL included in the word line cuts may be interconnected. A string may be formed by making a pillar connected to a bit line penetrate the at least one string selection line SSL, the word lines, and the at least one ground selection line GSL.

In FIG. 11, an embodiment of the inventive concept is exemplified as a structure between word line cuts (WL Cut) adjacent to each other in a sub block. However, the inventive concept is not limited thereto. For example, a structure between a word line cut and a string selection line cut may be defined as a sub block.

The block BLK according to an embodiment of the inventive concept may be implemented to have a merged word line structure where two word lines are merged to one.

Figure 12:
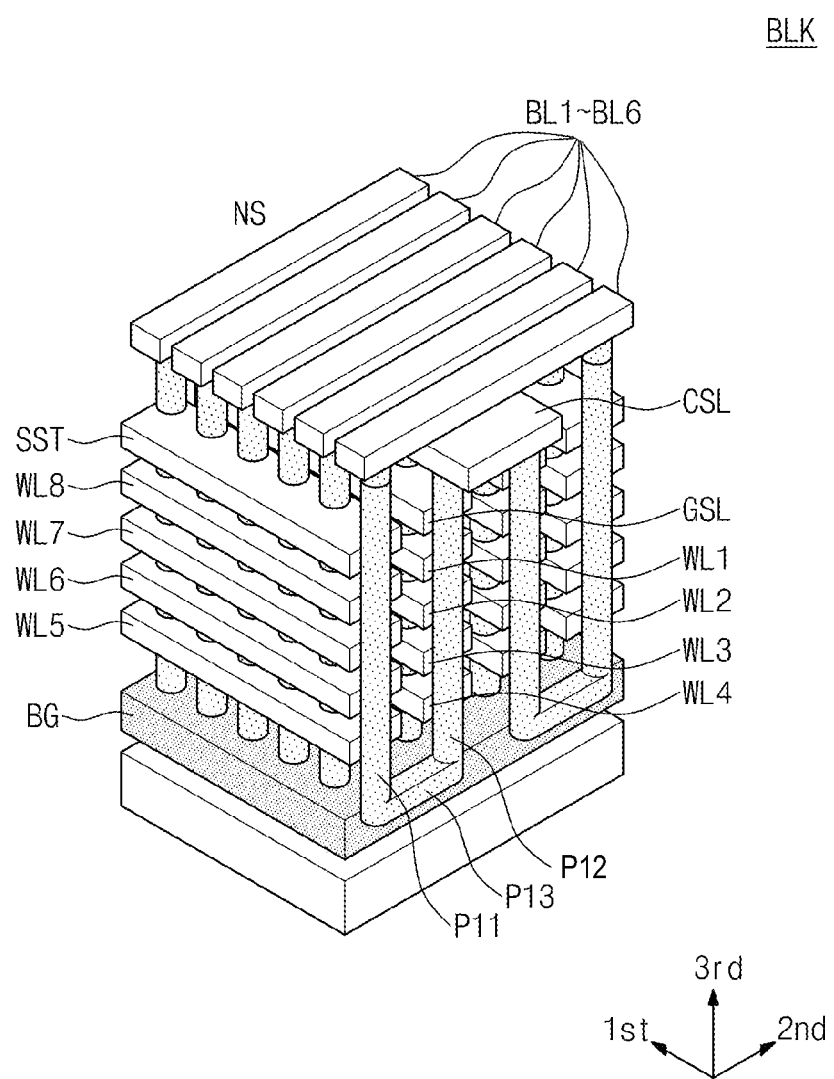
FIG. 12 is a perspective view of a block of VNAND according to another embodiment of the inventive concept.

FIG. 12 is a perspective view of a block of VNAND according to another embodiment of the inventive concept, wherein respective $1^{st}$, $2^{nd}$ and $3^{rd}$ directions are as shown. For the sake of easy understanding, it is assumed that the number of word line layers is 4. Referring to FIG. 12, a memory block BLK may be implemented to have a PBiCS (pipe-shaped bit cost scalable) structure in which lower ends of adjacent memory cells connected in series are connected through pipes. A memory block contains m-by-n strings NS (n and m being a natural number).

In FIG. 12, m=6 and n=2. Each string NS contains memory cells MC1 through MC8 that are connected in series. First upper ends of the memory cells MC1 through MC8 are connected to string selection transistors SST, second upper ends thereof are connected to ground selection transistors GST, and lower ends thereof are connected through pipes.

In each string NS, memory cells are formed to be stacked on a plurality of semiconductor layers. Each string NS contains a first pillar P11, a second pillar P12, and a pillar connection portion P13 connecting the first and second pillars P11 and P12. The first pillar P11 is connected to a bit line (e.g., BL1) and the pillar connection portion P13 and is formed to penetrate a string selection line SSL and word lines WL5 through WL8. The second pillar P12 is connected to a common source line CSL and the pillar connection portion P13 and is formed to penetrate a ground selection line GSL and word lines WL1 through WL4. As illustrated in FIG. 12, each string NS is formed with a U-shaped pillar.

In exemplary embodiments, a back-gate BG is formed on a substrate, and the pillar connection portion P13 is embedded in the back-gate BG. In exemplary embodiments, the back-gate BG may be used in common in the block BLK. The back-gate BG may be separated from a back-gate of another block.

The inventive concept is applicable to a solid state drive (SSD).

Figure 13:
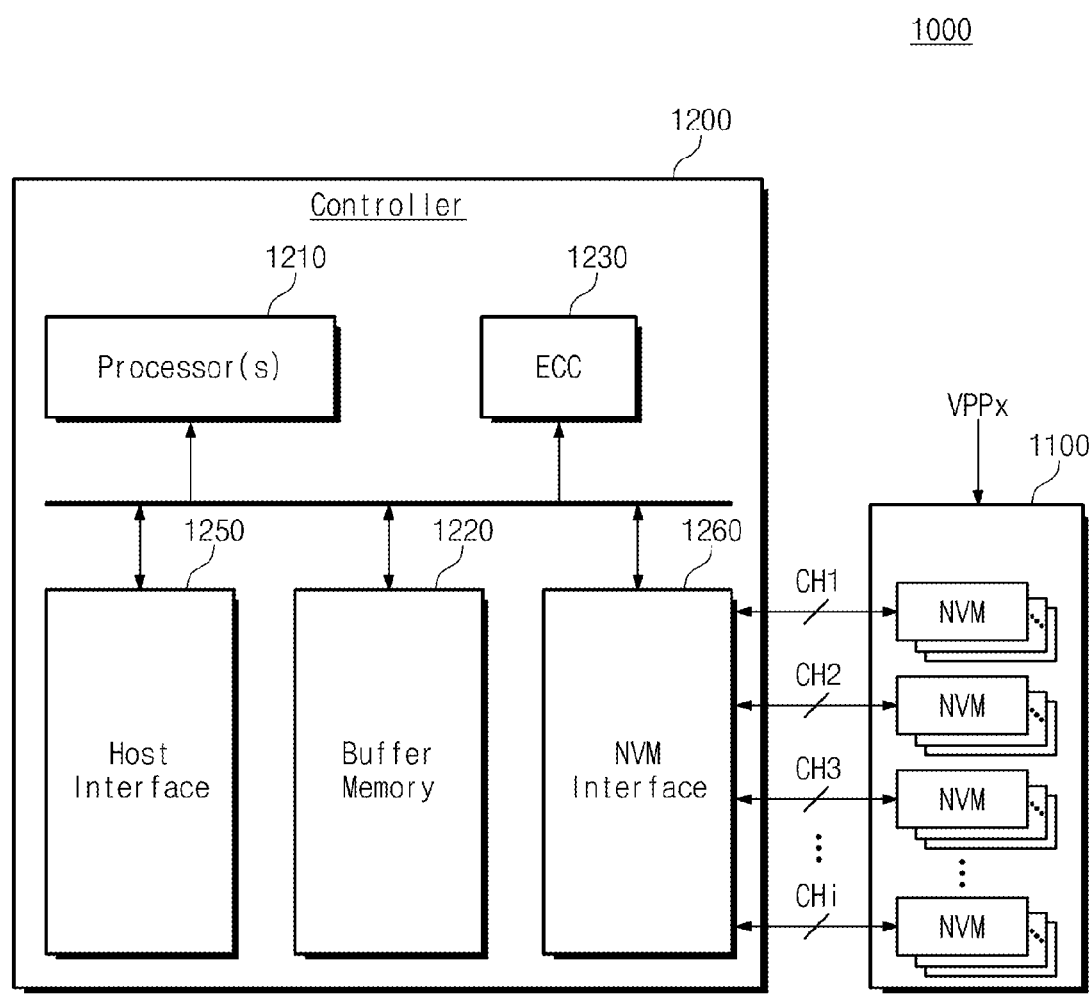
FIG. 13 is a block diagram schematically illustrating a solid state drive according to an embodiment of the inventive concept.

FIG. 13 is a block diagram schematically illustrating a solid state drive according to an embodiment of the inventive concept. Referring to FIG. 13, a solid state drive (hereinafter, referred to as SSD) 1000 includes a plurality of nonvolatile memory devices 1100 and an SSD controller 1200.

The nonvolatile memory devices 1100 are implemented to be provided with an external high voltage VPPx optionally. Each of the nonvolatile memory devices 1100 is implemented to execute a verification operation according to an embodiment of the inventive concept.

The SSD controller 1200 is connected to the nonvolatile memory devices 1100 through a plurality of channels CH1 through CHi (i being an integer of 2 or more). The SSD controller 1200 includes at least one processor 1210, a buffer memory 1220, an ECC block 1230, a host interface 1250, and a nonvolatile memory interface 1260.

The buffer memory 1220 temporarily stores data needed to drive the SSD controller 1200. The buffer memory 1220 may include a plurality of memory lines each of which stores data or a command. Here, the memory lines may be mapped to cache lines through various ways. The buffer memory 1220 stores page bit map information and read count information. The page bit map information and read count information is read out from the nonvolatile memory device 1100 at power-up and is updated according to an internal operation. The page bit map information and read count information thus updated is stored in the nonvolatile memory device 1100 periodically or randomly.

The ECC block 1230 is configured to calculate an ECC value of data to be programmed at a write operation, correct an error of read data according to an ECC value at a read operation, and correct an error of data restored from the nonvolatile memory device 1100 at a data restoration operation. Although not shown in FIG. 13, a code memory may be further included to store code data needed to drive the SSD controller 1200. The code memory may be implemented with a nonvolatile memory device.

The host interface 1250 provides an interface with an external device. The host interface 1250 may be a NAND flash interface. Besides, the host interface 1250 may be implemented with various interfaces or with a plurality of interfaces. The nonvolatile memory interface 1260 provides an interface with the nonvolatile memory devices 1100.

The SSD 1000 according to an embodiment of the inventive concept executes a program operation according to state data with the form of a sequential binary code and selects a target state after a sensing operation in a verification step, thereby improving programming speed.

The inventive concept is applicable to an eMMC (e.g., an embedded multimedia card, moviNAND, iNAND, etc.).

Figure 14:
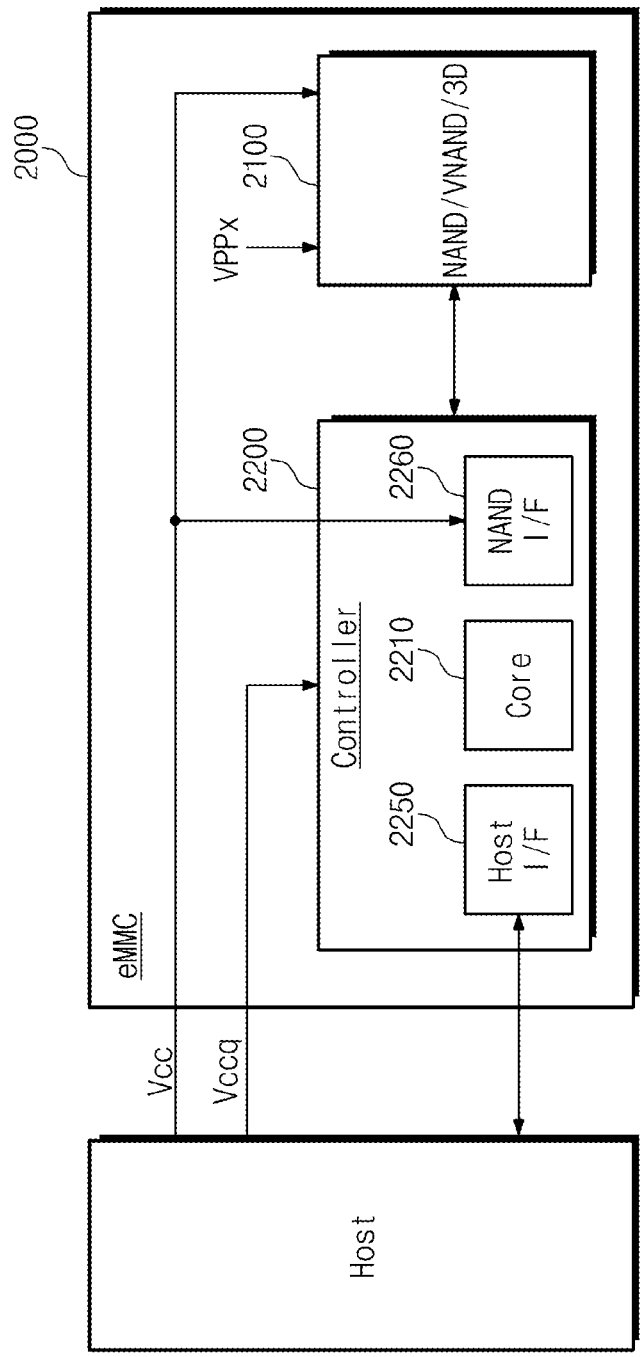
FIG. 14 is a block diagram schematically illustrating an eMMC according to an embodiment of the inventive concept.

FIG. 14 is a block diagram schematically illustrating an eMMC according to an embodiment of the inventive concept. Referring to FIG. 14, an eMMC 2000 includes at least one NAND flash memory device 2100 and a controller 2200.

The NAND flash memory device 2100 may be implemented to execute a program operation according to an embodiment of the inventive concept. For example, the NAND flash memory device 2100 performs a program operation using state data having the form of a sequential binary code. At a verification operation, the NAND flash memory device 2100 selects a target state after executing a sensing operation.

The controller 2200 is connected to the NAND flash memory device 2100 via a plurality of channels.

The controller 2200 includes at least one controller core 2210, a host interface 2250, and a NAND interface 2260. The controller core 2210 may control an overall operation of the eMMC 2000. The host interface 2250 is configured to interface between the controller 2200 and a host. The NAND interface 2260 is configured to interface between the NAND flash memory device 2100 and the controller 2200. In exemplary embodiments, the host interface 2250 may be a parallel interface (e.g., MMC interface). In other exemplary embodiments, the host interface 2250 of the eMMC 2000 may be a serial interface (e.g., UHS-II, UFS interface, etc.). As another example, the host interface 2250 may be a NAND interface.

The eMMC 2000 receives power supply voltages Vcc and Vccq from the host. Here, the power supply voltage Vcc (e.g., about 3.3 V) may be supplied to the NAND flash memory device 2100 and the NAND interface 2260, and the power supply voltage Vccq (e.g., about 1.8 V/3.3 V) may be supplied to the controller 2200. In exemplary embodiments, the eMMC 2000 may be optionally supplied with an external high voltage.

The eMMC 2000 according to an embodiment of the inventive concept executes a program operation according to state data with the form of a sequential binary code and selects a target state after a sensing operation in a verification step, thereby improving programming speed.

The inventive concept is applicable to Universal Flash Storage UFS.

Figure 15:
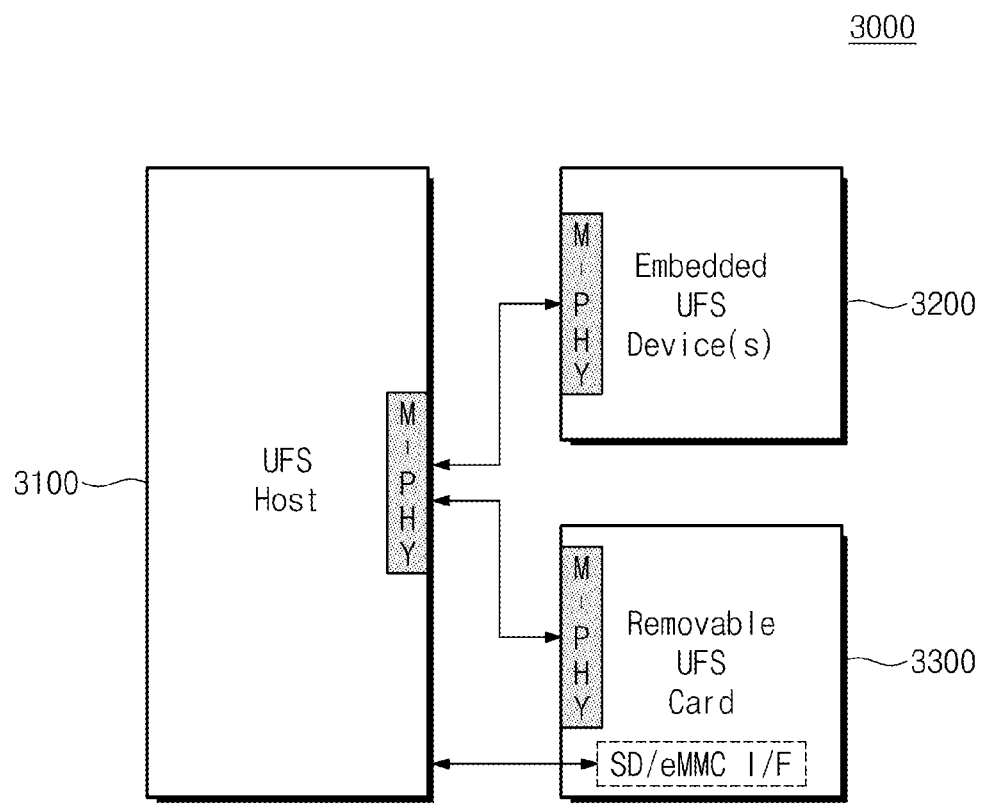
FIG. 15 is a block diagram schematically illustrating a UFS system according to an embodiment of the inventive concept.

FIG. 15 is a block diagram schematically illustrating a UFS system according to an embodiment of the inventive concept. Referring to FIG. 15, a UFS system 3000 includes a UFS host 3100, at least one embedded UFS device 3200, and a removable UFS card 3300. Communication between the UFS host 3100 and the embedded UFS device 3200 and communication between the UFS host 3100 and the removable UFS card 3300 may be performed through M-PHY layers.

At least one of the embedded UFS device 3200 and the removable UFS card 3300 may be implemented to perform a verification operation according to an embodiment of the inventive concept.

Meanwhile, the host 3100 includes a bridge that enables the removable UFS card 3300 to communicate using the protocol different from the UFS protocol. The UFS host 3100 and the removable UFS card 3300 may communicate through various card protocols (e.g., UFDs, MMC, SD (secure digital), mini SD, Micro SD, etc.).

The inventive concept is applicable to a mobile device.

Figure 16:
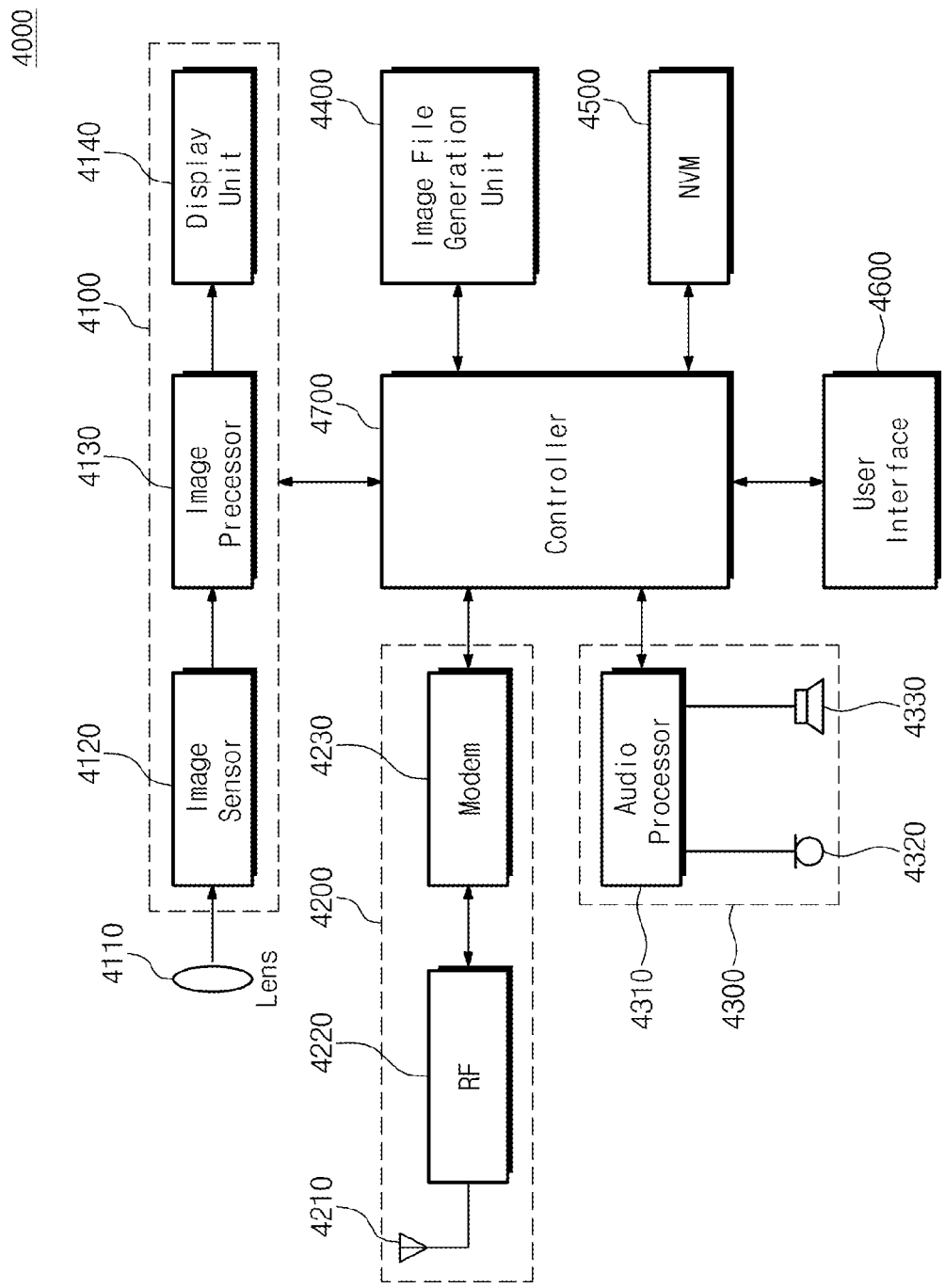
FIG. 16 is a block diagram schematically illustrating a handheld terminal including a nonvolatile memory device according to an embodiment of the inventive concept.

FIG. 16 is a block diagram schematically illustrating a handheld terminal including a nonvolatile memory device according to an embodiment of the inventive concept. Referring to FIG. 16, a handheld terminal 4000 according to an embodiment of the inventive concept includes an image processing unit 4100, a wireless transceiver unit 4200, an audio processing unit 4300, an image file generating unit 4400, a nonvolatile memory device 4500, a user interface 4600, and a controller 4700.

The image processing unit 4100 includes a lens 4110, an image sensor 4120, an image processor 4130, and a display unit 4140. The wireless transceiver unit 4200 includes an antenna 4210, a transceiver 4220, and a modem 4230. The audio processing unit 4300 includes an audio processor 4310, a microphone 4320, and a speaker 4330.

The nonvolatile memory device 4500 may be implemented with memory cards, including MMC, eMMC, SD, and micro SD. The controller 4700 may be implemented with a system on chip that drives application programs and an operating system. A kernel of the operating system run on the system on chip may include an input/output scheduler and a device driver for controlling the nonvolatile memory device 4500. The device driver may control access performance of the nonvolatile memory device 4500 referring to the number of sync queues that the input/output scheduler or control CPU modes, DVFS levels, and so on of the system on chip.

A nonvolatile memory device and/or a controller according to embodiments of the inventive concept may be packed by one selected from various types of packages such as PoP (Package on Package), Ball grid arrays (BGAs), Chip scale packages (CSPs), Plastic Leaded Chip Carrier (PLCC), Plastic Dual In-Line Package (PDIP), Die in Waffle Pack, Die in Wafer Form, Chip On Board (COB), Ceramic Dual In-Line Package (CERDIP), Plastic Metric Quad Flat Pack (MQFP), Thin Quad Flatpack (TQFP), Small Outline (SOIC), Shrink Small Outline Package (SSOP), Thin Small Outline (TSOP), System In Package (SIP), Multi Chip Package (MCP), Wafer-level Fabricated Package (WFP), and Wafer-Level Processed Stack Package (WSP).

While the inventive concept has been described with reference to exemplary embodiments, it will be apparent to those skilled in the art that various changes and modifications may be made without departing from the spirit and scope of the present invention. Therefore, it should be understood that the above embodiments are not limiting, but illustrative.

What is claimed is:

1. A nonvolatile memory device comprising:
a memory cell array including a plurality of memory cells;
a page buffer block including page buffers connected to a plurality of bit lines connected with the plurality of memory cells, respectively; and
control logic configured to apply a program voltage to selected ones of the plurality of memory cells, apply a selected one of a plurality of verification voltages after pre-charging bit lines connected to memory cells to which the program voltage is applied, control the page buffers such that a sensing operation is performed with respect to memory cells to which the selected verification voltage is applied, and control the page buffers referring to the sensing result and target state data such that memory cells programmed to a target state are selected.

2. The nonvolatile memory device of claim 1, wherein each of the page buffers includes:
a plurality of data latches configured to store state data corresponding to a state to be programmed at a program operation;
a cache latch configured to receive program data from an external device to transfer the input program data to the plurality of data latches, at the program operation;
a pre-charge circuit configured to apply a pre-charge voltage to the bit lines, before the sensing operation; and
a sense latch configured to store sensing data by latching a voltage of a bit line according to the sensing operation.

3. The nonvolatile memory device of claim 2, wherein the control logic is further configured to select the target state by dumping at least one bit of data stored in the data latches into the sense latch.

4. The nonvolatile memory device of claim 3, wherein the state data is reordered into the form of a sequential binary code under a control of the control logic.

5. The nonvolatile memory device of claim 3, wherein the memory cell array is a three-dimensional memory array.

6. A method of programming a nonvolatile memory device, the method comprising:
applying a program voltage to selected ones of a plurality of memory cells;
applying a selected one of a plurality of verification voltages after pre-charging bit lines connected to memory cells to which the program voltage is applied;
sensing the memory cells to which the selected verification voltage is applied;
selecting memory cells programmed to a target state referring to the sensing result and target state data; and
determining whether programming of the selected memory cells is passed or failed.

7. The method of claim 6, wherein the selecting includes:
excluding upper states having a threshold voltage higher than the target state by dumping at least one bit of state data stored in data latches, at a sense latch.

8. The method of claim 7, further comprising:
dumping the data latches with a reference data bit such that the target memory cells are inhibited.

9. The method of claim 8, wherein the state data is set according to an ordering with the form of a sequential binary code.

10. The programming method of claim 8, further comprising:
initializing a value of the sense latch before the pre-charging.

11. The method of claim 8, wherein the data latches are dumped with the reference data bit such that memory cells programmed to a threshold voltage lower than the target state and sensed to be an off-cell are inhibited.

12. The method of claim 8, wherein at least one bit of the state data is dumped into the sense latch such that memory cells which is programmed to a threshold voltage higher than the target state but of which the programming is not completed are not inhibited.

13. The method of claim 8, wherein an ordering of state data in the programming is different from that of state data provided as a default value.

14. The method of claim 13, further comprising:
reordering the state data provided as the default value into the form of the sequential binary code before the programming.

15. The method of claim 8, wherein an ordering of state data in the programming is equal to that of state data provided as a default value.

16. A method of programming a nonvolatile memory device which includes a plurality of page buffers, each of which has a sense latch and a plurality of data latches, the method comprising:
applying a program voltage to selected ones of a plurality of memory cells;
applying a selected one of a plurality of verification voltages after pre-charging bit lines connected to memory cells to which the program voltage is applied;
sensing the memory cells to which the selected verification voltage is applied;
selecting memory cells programmed to a target state referring to the sensing result stored in the sense latch and target state data; and
determining whether programming of the selected memory cells is passed or failed, based on the sensing result.

17. The method of claim 16, wherein the selecting includes:
excluding upper states having a threshold voltage higher than the target state by dumping at least one bit of state data stored in data latches, at a sense latch.

18. The method of claim 17, further comprising:
dumping the data latches with a reference data bit such that the target memory cells are inhibited.

19. The method of claim 18, wherein the state data is binary code that is arranged in an ascending order or a descending order.

20. The method of claim 19, wherein the data latches are dumped with the reference data bit such that memory cells programmed to a threshold voltage lower than the target state and sensed to be an off-cell are inhibited.

* * * * *